United States Patent [19]

Yokoyama

[11] Patent Number: 4,513,245
[45] Date of Patent: Apr. 23, 1985

[54] DC CURRENT DETECTOR
[75] Inventor: Tatsuo Yokoyama, Kakogawa, Japan
[73] Assignee: Fujitsu Ten Limited, Kobe, Japan
[21] Appl. No.: 398,383
[22] Filed: Jul. 14, 1982
[30] Foreign Application Priority Data
  Jul. 15, 1981 [JP] Japan .................. 56-110275
[51] Int. Cl.³ .............. G01R 19/22; G01R 1/30
[52] U.S. Cl. .................. 324/119; 324/123 R; 324/132
[58] Field of Search ........... 324/119, 132, 123 R; 364/571; 328/162
[56] References Cited
  U.S. PATENT DOCUMENTS
  1,966,047  7/1934  Ryall .......................... 324/119
  2,198,226  4/1940  Peterson ....................... 324/119
  2,294,065  8/1942  Anderson ....................... 324/119
  3,962,631  6/1976  Poppinger ...................... 324/119

Primary Examiner—Ernest F. Karlsen
Attorney, Agent, or Firm—Staas & Halsey

[57] ABSTRACT

In a DC current detector, a current to be detected is applied to a current detecting resistor connected in series with a first diode, a voltage across the current detecting resistor is amplified by a transistor and the detected voltage is output from a collector resistor connected to the collector of the transistor. The voltage across the current detecting resistor is provided across the emitter and base of the transistor via an emitter resistor, and a second diode. A resistor the resistance value of which is selected so that the forward voltage of the second diode and the base-emitter voltage of the transistor may become equal to each other, is connected to the base of the transistor. The current detection accuracy is improved.

9 Claims, 8 Drawing Figures

DC CURRENT DETECTOR

BACKGROUND OF THE INVENTION

1. Field of the Invention

The present invention relates to a DC current detector which is simple and hence economical in construction but capable of detecting DC current with a high degree of accuracy.

2. Description of the Prior Art

A known circuit arrangement for detecting a DC current is such, for example, as shown in FIG. 1. In FIG. 1, reference character OPA indicates an operational amplifier; R and $R_1$ to $R_4$ designate resistors; and $V_{CC}$ and $V_{SS}$ identify voltages. A current I flows across the current detecting resistor R, and a potential difference thereacross is derived as a current detected voltage $e_0$ from a differential amplifier circuit made up of the resistors $R_1$ to $R_4$ and the operational amplifier OPA. The current detected voltage $e_0$ is given as follows:

$$e_0 = \left(\frac{R_1 + R_2}{R_3 + R_4}\right) \cdot \frac{R_4}{R_1} \cdot e_2 - \frac{R_2}{R_1} \cdot e_1 \quad (1)$$

where $e_1$ and $e_2$ are detected potentials at both ends of the resistor R. Since $e_2 = e_1 + I \cdot R$, the current detected voltage $e_0$ becomes as follows:

$$e_0 = \frac{R_4/R_3 - R_2/R_1}{1 + R_4/R_3} \cdot e_1 + \frac{1 + R_2/R_1}{1 + R_4/R_3} \cdot \frac{R_4}{R_3} \cdot I \cdot R \quad (2)$$

If the resistance values of the resistors $R_1$ to $R_4$ are selected to bear such relationships that $R_1 = R_3$ and $R_2 = R_4$, then $$e_0 = \frac{R_4}{R_3} \cdot I \cdot R = \frac{R_2}{R_1} \cdot I \cdot R \quad (3)$$

In Eq. (2), when $R_4/R_3 \neq R_2/R_1$, the first term on the right side represents an error and the coefficient of the second term on the right side, $$\frac{1 + R_2/R_1}{1 + R_4/R_3},$$

causes an amplification error. To avoid this, it is necessary to employ high precision resistors to ensure that $R_1 = R_3$ and $R_2 = R_4$. Further, the potential $e_1$ also has a marked influence on the detection error.

Moreover, this prior art DC current detector has the defect that its operation range is narrow. That is, this circuit calls for such relationships that $$V_{SS} < e_2 \cdot \left(\frac{R_4}{R_3 + R_4}\right)$$

(i.e. in-phase input voltage to the operational amplifier-)$< V_{CC}$. Usually a difference ($V_{CC} - V_{SS}$) between the voltages $V_{CC}$ and $V_{SS}$ applied to the operational amplifier OPA is substantially in the range of 30 to 40 V. In the case where the operating voltage is approximately in the range of 30 to 40 V setting the voltage $V_{SS}$ to 0 V. and $$\frac{R_4}{R_3 + R_4} < < 1,$$

the detected voltage $e_0$ diminishes, in consequence of which a post-stage amplifier is required. In this case, the detection error is also amplified.

SUMMARY OF THE INVENTION

It is therefore an object of the present invention to provide a DC current detector which is free from such defects of the prior art as mentioned above and which is simple in construction but permits high precision DC current detection.

Briefly stated, according to the present invention, a current to be detected is applied to a current detecting resistor and a first diode; and a voltage across the current detecting resistor is provided to the emitter of a transistor via an emitter resistor and the base of the transistor via a second diode. A detected voltage is derived from a collector resistor connected to the collector of the transistor. A resistor is connected to the base of the transistor so that the base-emitter voltage of the transistor and the forward voltage of the second diode may be equal to each other.

DESCRIPTION OF THE PREFERRED EMBODIMENTS

Figure 2:
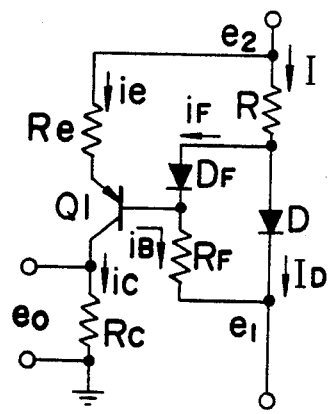
FIGS. 2 to 6 are circuit diagrams of embodiments of the present invention.

FIG. 2 is a circuit diagram of the principal part of an embodiment of the present invention. Reference character Q1 indicates a transistor; R, $R_F$, $R_e$ and $R_c$ designate resistors; and D and $D_F$ identify diodes. The resistor R for current detection use and the first diode D are connected in series. A voltage across the resistor R is applied to the emitter and the base of the pnp transistor Q1 via the emitter resistor $R_e$ and the second diode $D_F$. The collector resistor $R_c$ is connected to the collector of the transistor Q1. A detected voltage $e_0$ amplified by the transistor Q1 is derived across the collector resistor $R_c$.

The voltage across the resistor R, corresponding to the magnitude of a current I to be detected, is amplified by the transistor Q1, from which the detected voltage $e_0$ is derived as described above. The current I, a current $I_D$ flowing across the diode D, an emitter current $i_e$, a base current $i_B$, a collector current $i_c$ and a current $i_F$ flowing across the diode $D_F$ bear the following relationships relationships $I = I_D + I_F$ and $i_e = i_c + i_B$ $= i_c(1 + 1/h_{FE})$, where $h_{FE}$ is the common-collector current amplification factor of the transistor Q1. A transistor having a large $h_{FE}$ is selected and the resistance values of the resistors $R_e$ and $R_F$ are determined so that $I \approx I_D > > i_F$ and $i_c > > i_B$, by which $V_D > V_{BE} \approx V_F$, where $V_D$ is a forward voltage of the diode D based on the current $I_D$, $V_{BE}$ is a base-emitter voltage of the transistor Q1 AND $V_F$ is a forward voltage of the diode $D_F$.

Accordingly, the detected voltage $e_0$ is the product of the collector current $i_c$ and the collector resistance $R_c$, and hence becomes as follows:

$$e_0 = i_c \cdot R_c = \frac{1}{1 + 1/h_{FE}} \cdot \frac{R_c}{R_e} \cdot \{I \cdot R + (V_F - V_{BE})\} \quad (4)$$

where $e_0 < (E_1 + V_D)$.

In Eq. (4), $$\left( \frac{1}{1 + 1/h_{FE}} \right)$$

is an amplification error and $(V_F - V_{BE})$ is an error. Since it is possible, however, to select the resistance $R_e$ so that the emitter current $i_e$ may be lower than several milliamperes although the current I is higher than several hundres milliamperes, and since a transistor having an $h_{FE}$ larger than 100 is also easily available, $1/h_{FE}$ becomes substantially equal to zero; therefore, the amplification error can be neglected. Further, since the emitter current $i_e$ becomes small, a temperature variation in $h_{FE}$ becomes negligible. Moreover, since it is possible to obtain $V_F = V_{BE}$ by a selection of the resistance $R_F$, the error is reduced to zero. As a result of this, Eq. (4) becomes as follows:

$$e_0 = \frac{R_c}{R_e} \cdot I \cdot R \quad (5)$$

Thus, the detected voltage proportional to the current I can be obtained.

As will be seen from Eqs. (4) and (5), the DC current detector of the present invention does not necessitate the use of such high precision resistors as would be required in the prior art example described previously, and it is free from the influence of the detected potential $e_1$. Besides, $(V_F - V_{BE})$ in Eq. (4) can be reduced to zero by a suitable selection of the resistance $R_F$ because the $i_c - V_{BE}$ characteristic of the transistor Q1 and the $i_F - V_F$ characteristic of the diode $D_F$ are equal to each other.

Figure 3:
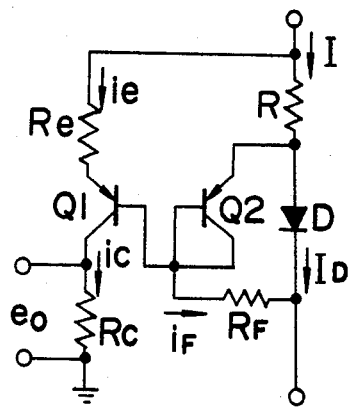

FIG. 3 is a circuit diagram of another embodiment of the present invention, which employs paired transistors Q1 and Q2. That is, the one transistor Q2 is diode-connected and used as the diode $D_F$ utilized as the diode $D_F$ in FIG. 2. By selecting the resistance $R_F$ so that $i_e = i_F$, the potential difference between the emitters of the transistors Q1 and Q2 is reduced to zero, and since both transistors Q1 and Q2 have the same characteristics, errors do not become large due to temperature variations. In FIG. 3, the parts corresponding to those in FIG. 2 are identified by the same reference characters, and the relation between the detected voltage $e_0$ and current I is the same as in the aforementioned embodiment.

Figure 4:
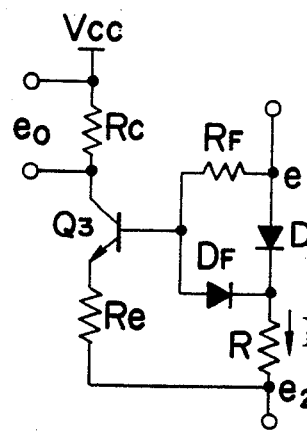

FIG. 4 is a circuit diagram of another embodiment of the present invention which employs an npn transistor Q3. This embodiment shows that an npn transistor can be used although the embodiments of FIGS. 2 and 3 employ the pnp transistor Q1. Accordingly, in this embodiment, the voltage $V_{CC}$ is applied via the collector resistor $R_c$ to the transistor W3, and the connection of the resistor $R_F$ and the diode $D_F$ is opposite to that in the embodiments of FIGS. 2 and 3 relative to the diode D. The detected voltage $e_0$ is identical with that given by Eqs. (4) and (5).

In the above-described embodiments, letting the collector-emitter voltage be represented by $V_{CE}$, the operating voltage range is $0 \leq e_0 = i_c \cdot R_c < (e_1 + V_D) \leq V_{CE}$ in the embodiments of FIGS. 2 and 3, whereas, in the embodiment of FIG. 4, if $V_{CC} = 0$, the operating voltage range is $0 \geq -e_0 = -i_c \cdot R_c > -(e_1 + V_D) > -V_{CE}$. Since a transistor of the collector-emitter voltage $V_{CE}$ above 50 V is also easily available, the operating voltage range becomes wider than in the case of the prior art example.

In the foregoing embodiments, when the emitter current $i_e$ varies in proportion to the current I ($\Delta I/I = \Delta i_c/i_e$), a variation $\Delta i_F$ of the current $i_F$ dependent on a variation $\Delta V_D$ in the forward voltage $V_D$ of the diode D becomes $\Delta i_F < \Delta i_e \approx \Delta i_c$, so that as the variation $\Delta I$ in the current I increases, $\Delta V_F$ of the forward voltage $V_F$ of the diode $D_F$ and a variation $\Delta V_{BE}$ of the base-emitter voltage $V_{BE}$ of the transistor, bear a relation $\Delta V_F < \Delta V_{BE}$. Accordingly, even if the resistance $R_F$ is selected so that $(V_F - V_{BE})$ becomes zero at a certain current $I_0$, there is the possibility that the error $(V_F - V_{BE})$ increases with an increase in $(I - I_0)$, resulting in a detecting error.

Figure 5:
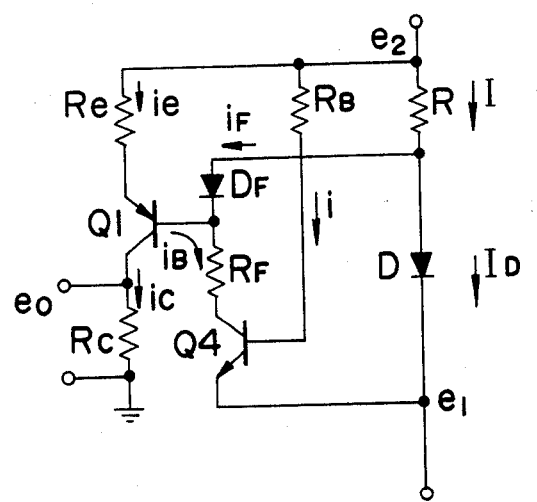

FIG. 5 is a circuit diagram of another embodiment of the present invention which is designed for further reduction of the detection error based on the variation $\Delta I$ of the current I in the foregoing embodiments. In this embodiment, a transistor Q4 and a resistor $R_B$ are added to the arrangement of FIG. 2. Letting the base-emitter voltae of the transistor Q4 be represented by $V_{BE4}$ and its base current be represented by i, their relationship to the current I flowing across the resistor R is as follows:

$$I \cdot R + V_D = i \cdot R_B + V_{BE4} \quad (6)$$

Accordingly, an increase in the current I causes an increase in the base current i. The collector current is $(i_F + i_B)$ and since $i_F >> i_B$, $(i_F + i_B) \approx i_F$ and the current $i_F$ also increases. Letting the common emitter current amplification factor of the transistor Q4 be represented by h, it follows that $$i_F = h \cdot i = (h/R_B) \cdot (I \cdot R + V_D - V_{BE4}) \quad (7)$$

in this equation, it is shown that if $(V_D - V_{BE4}) = 0$, then $\Delta i_F/i_F = \Delta I/I$.

In practice, since the variation $\Delta V_D$ of the forward voltage $V_D$ for a variation $\Delta I_D$ of the current $I_D$ flowing across the diode D in a large current region and a variation $\Delta V_{BE4}$ of the base-emitter voltage $V_{BE4}$ for a variation $\Delta i$ of the base current i in a small current region differ, there are some occasions when the voltages $V_D$ and $V_{BE4}$ do not become equal, nor do their variations $\Delta V_D$ and $\Delta V_{BE4}$ become equal. However, when the current I is above 100 mA, it is possible to obtain $I \cdot R > (V_D - V_{BE4}) \geq 0$ by adjustment of the base current i using the resistor $R_B$, and since $(V_D - V_{BE4})/I \cdot R$ approaches zero as the current I increases, the detection accuracy rises over a wide range. In addition, the resistor $R_F$ may also be omitted because the collector resistance of the transistor Q4 itself is large.

Figure 6:
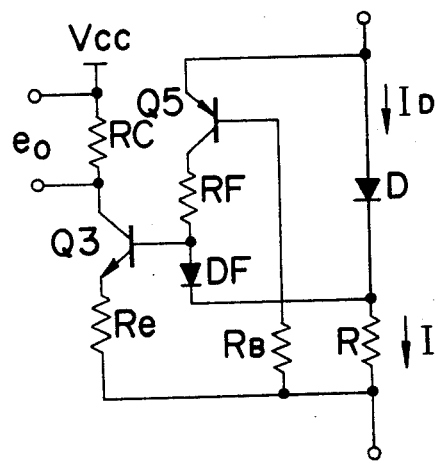

FIG. 6 is a circuit diagram of another embodiment of the present invention in which a transistor Q5 and a resistor $R_B$ are added to the embodiment of FIG. 4. As is the case with the foregoing embodiments, the current $i_F$ is controlled by the transistor Q5 so that $\Delta i_F/i_F \approx \Delta I/I$ and an error $(V_D - V_{BE5})$ is adjusted by the resistor $R_B$.

$V_{BE5}$ is a base-emitter voltage of the transistor Q5. Also in the embodiments of FIGS. 5 and 6, the transistors Q1 and Q3 and the diode $D_F$ can be formed by paired transistors in the same manner as in the embodiment of FIG. 3.

Figure 1:
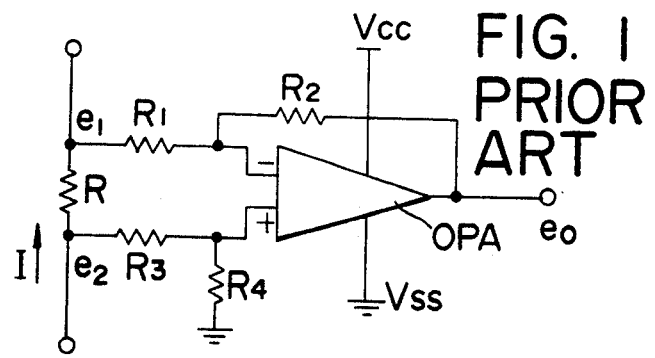
FIG. 1 is a circuit diagram of a conventional DC current detector.
Figure 7:
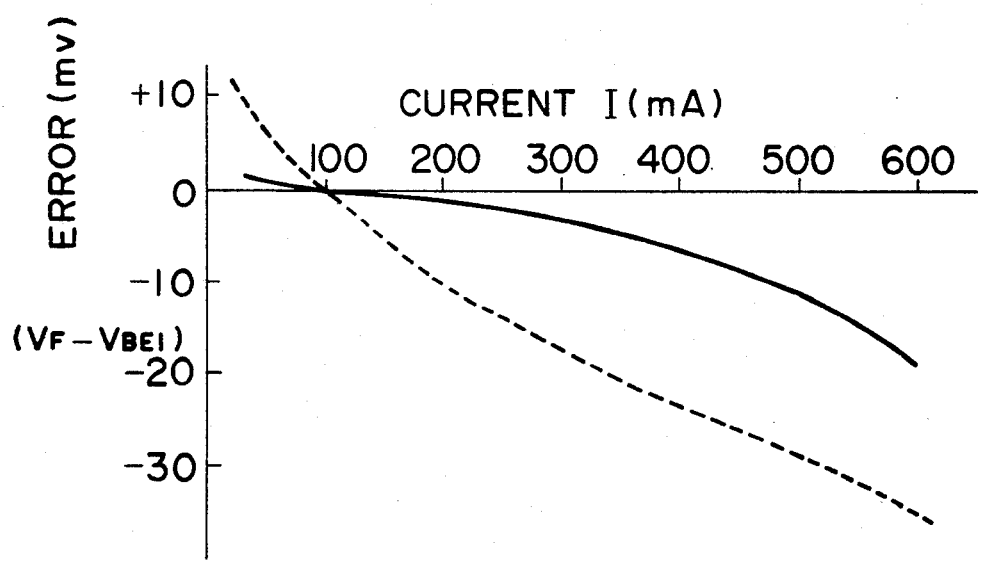
FIGS. 7 and 8 are graphs of characteristic curves of error and percentage detection error for the embodiments depicted in FIGS. 2 and 5, respectively.
Figure 8:
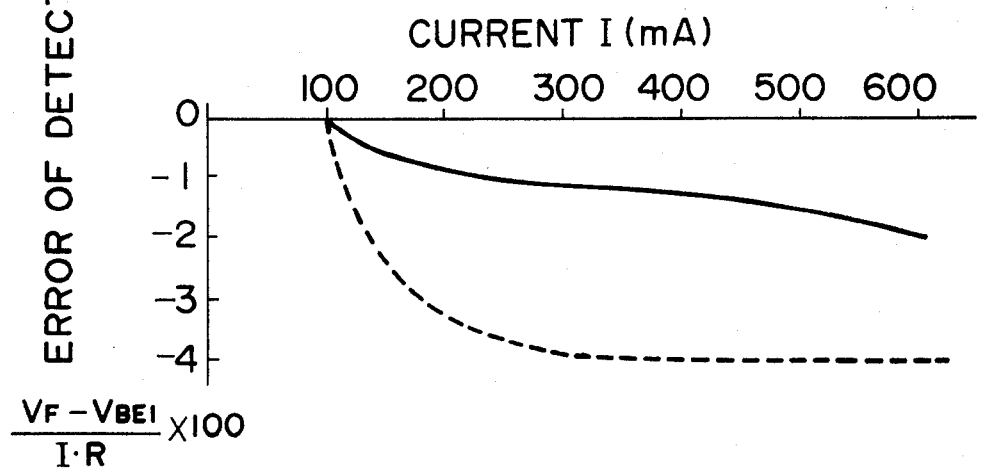

FIGS. 7 and 8 are graphs of error and percentage detection error for the embodiments of FIGS. 2 and 5 in the case where $R_e = R_c = 1$ KΩ, R = 1.5 Ω, $R_B = 170$ KΩ, $R_F = 470$ Ω in FIG. 2 and $R_F = 100$ Ω in FIG. 5. In the prior art example of FIG. 1, an error dependent on the accuracy of the resistors $R_1$ to $R_4$, a change in the detected potential and an offset voltage of the operational amplifier OPA occurs independently of the current I. For instance, in the case where $R_2/R_1 = 2$, $R_4/R_2 = 1.005$, $R_3/R_1 = 0.995$, $e_1 = 10$ (v) and an offset voltage = 3 mV, the error is about 75 mV. Taking the above into account, in the embodiments of the present invention the error decreases and the detection error is not more than 4% in the embodiment of FIG. 2 and not more than 2% in the embodiment of FIG. 5.

As has been described in the foregoing, the DC current detector of the present invention comprises the first diode D connected in series to the current detecting resistor R in the forward direction with respect to the current I to be detected, the transistor Q1 or Q3 and the resistor RF. The transistor Q1 or Q3 has its emitter connected via the emitter resistor $R_e$ to one end of the current detecting resistor R its base connected via the second diode $D_F$ to the other end of the resistor R, and its collector connected to the collector resistor $R_c$ for taking out the detected voltage $e_0$. The resistor $R_F$ equalizes the base-emitter voltage $V_{BE}$ of the transistor Q1 or Q3 and the forward voltage $V_F$ of the second diode $D_F$. The error can be reduced to zero without requiring the high precision selection of resistors, and the amplification error can also be reduced through utilization having a transistor of large current amplification factor $h_{FE}$. Accordingly, a DC current can be detected with high accuracy. Further, since a transistor of high withstand voltage is also readily available, the operating voltage range can also be enlarged. Moreover, the DC current detector of the present invention is small in power consumption, and hence can be fabricated as a hybrid integrated circuit, too.

Besides, the second transistor Q4 or Q5 is provided in combination with the first transistor Q1 or Q3 and the base current of the second transistor Q4 or Q5 is selected so that the forward current voltage $V_D$ of the first diode D and the base-emitter voltage of the second transistor Q4 or Q5 may become equal to each other, by which the detection error can be markedly reduced even if the current I to be detected varies over a wide range; for instance, a current I of 100 mA or more can be detected with high accuracy.

It will be apparent that many modifications and variations may be effected witout departing from the scope of the novel concepts of the present invention.

What is claimed is:

1. A DC current detector comprising:
   a current detecting resistor having first and second terminals;
   a first diode connected to the first terminal of said current detecting resistor in series with said current detecting resistor in a forward direction relative to a current to be detected;
   an emitter resistor connected to the second terminal of said current detecting resistor;
   a second diode connected to the first terminal of said current detecting resistor;
   a transistor having an emitter connected to said emitter resistor, having a base connected to said second diode at a first node, and having a collector;
   a collector resistor having a first terminal connected to the collector of said transistor, having a second terminal, and having a detected voltage across the first and second terminals of said collector resistor; and
   an equalizing resistor, operatively connected to said first node and said first diode, for equalizing the base-emitter voltage of said transistor and the forward voltage of said second diode.

2. A DC current detector comprising:
   a current detecting resistor having first and second terminals;
   a first diode connected to the first terminal of said current detecting resistor in series with said current detecting resistor in a forward direction relative to a current to be detected;
   an emitter resistor connected to the second terminal of said current detecting resistor;
   a second diode connected to the first terminal of said current detecting resistor;
   a first transistor having an emitter connected to said emitter resistor, having a base connected to said second diode and having a collector;
   a collector resistor having a first terminal connected to the collector of said first transistor, having a second terminal, and having a detected voltage across the first and second terminals of said collector resistor;
   an equalizing resistor operatively connected to the base of said first transistor and said second diode, for equalizing the base-emitter voltage of said first transistor and the forward voltage of said second diode; and
   a second transistor connected in series with said equalizing resistor and having a base current selected so that the forward voltage of said first diode and the base-emitter voltage of said second transistor are equal to each other.

3. A DC current detector as set forth in claim 1, wherein said transistor comprises a pnp transistor.

4. A DC current detector as set forth in claim 1, wherein said second diode comprises a diode connected transistor, and wherein said transistor and said diode connected transistor comprise a matched pair of transistors.

5. A DC current detector as set forth in claim 4, wherein said transistor and said diode connected transistor comprise pnp transistors.

6. A DC current detector as set forth in claim 1, wherein said transistor comprises an npn transistor.

7. A DC current detector as set forth in claim 2, wherein said first transistor comprises a pnp transistor and said second transistor comprises an npn transistor.

8. A DC current detector as set forth in claim 2, wherein said first transistor comprises an npn transistor and said second transistor comprises a pnp transistor.

9. A DC current detector as set forth in claim 2, wherein said second transistor has a base, said DC current detector further comprising a base resistor connected between the base of said second transistor and the second terminal of said current detecting resistor.

* * * * *

UNITED STATES PATENT AND TRADEMARK OFFICE
CERTIFICATE OF CORRECTION

PATENT NO. : 4,513,245

DATED : APRIL 23, 1985

INVENTOR(S) : TATSUO YOKOYAMA

It is certified that error appears in the above-identified patent and that said Letters Patent is hereby corrected as shown below:

FRONT PAGE [57] ABSTRACT
line 9, "resistor the" should be --resistor, the--.

Col. 1, line 62, "amplifier-" should be --amplifier)--;
line 63, delete ")" (first occurrence).

Col. 2, line 58, "$D_F$bear" should be --$D_F$ bear--;
line 59, "ships" should be --ships:--; and delete "relationships";
line 63, "$R_F$are" should be --$R_F$ are--;
line 67, "AND" should be --and--.

Col. 3, line 8, "($E_1$" should be --($e_1$--;
line 20, "hundres" should be --hundred--;
line 66, "W3" should be --Q3--.

Col. 4, line 31, "voltae" should be --voltage--.

UNITED STATES PATENT AND TRADEMARK OFFICE
CERTIFICATE OF CORRECTION

PATENT NO. : 4,513,245

DATED : APRIL 23, 1985

INVENTOR(S) : TATSUO YOKOYAMA

It is certified that error appears in the above-identified patent and that said Letters Patent is hereby corrected as shown below:

Col. 5, line 37, "having" should be --of--; and
"of" should be --having a--;
line 56, "witout" should be --without--.

Signed and Sealed this

Thirteenth Day of August 1985

[SEAL]

Attest:

DONALD J. QUIGG

Attesting Officer     Acting Commissioner of Patents and Trademarks